(12) United States Patent
Gloekler et al.

(10) Patent No.: US 10,459,031 B2
(45) Date of Patent: Oct. 29, 2019

(54) ELECTRONIC CIRCUIT HAVING SERIAL LATCH SCAN CHAINS

(71) Applicant: GLOBALFOUNDRIES INC., Grand Cayman (KY)

(72) Inventors: Tilman Gloekler, Gaertringen (DE); Andreas Koenig, Boeblingen (DE); Jens Kuenzer, Böblingen (DE); Cedric Lichtenau, Stuttgart (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 346 days.

(21) Appl. No.: 14/520,115

(22) Filed: Oct. 21, 2014

(65) Prior Publication Data

US 2015/0113346 A1    Apr. 23, 2015

(30) Foreign Application Priority Data

Oct. 21, 2013 (GB) .................................. 1318518.6

(51) Int. Cl.
*G01R 31/3185* (2006.01)
*G01R 31/30* (2006.01)

(52) U.S. Cl.
CPC ................ *G01R 31/318563* (2013.01); *G01R 31/318544* (2013.01)

(58) Field of Classification Search
CPC .... G01R 31/318563; G01R 31/318544; G01R 31/2856; G06F 11/2284; G06F 11/27; G11C 29/12
See application file for complete search history.

(56) References Cited

U.S. PATENT DOCUMENTS

| 6,021,514 A * | 2/2000 | Koprowski ...... G01B 31/31855 714/733 |
| 7,360,134 B1 | 4/2008 | Jacobson et al. |
| 2003/0149925 A1 * | 8/2003 | Angelotti ......... G01R 31/31813 714/726 |

(Continued)

FOREIGN PATENT DOCUMENTS

CN            101187958 A        5/2008

OTHER PUBLICATIONS

"Pratel 99 SE", Journal of Adult Education College of Hubei University, Feb. 2003, pp. 68-70, vol. 21, No. 1, with English Language abstract.

*Primary Examiner* — Cynthia Britt
*Assistant Examiner* — Dipakkumar B Gandhi
(74) *Attorney, Agent, or Firm* — Michael LeStrange; Hoffman Warnick LLC

(57) ABSTRACT

The invention relates to an electronic circuit (10) having one or more latch scan chains (12), the electronic circuit (10) comprising (i) a built-in test structure (14); (ii) generation means (16) for simultaneously generating scan-in data for each of said scan chains (12); (iii) interception means (18) for simultaneously intercepting test lines (20) of said scan chains (12), said test lines (20) comprising scan-in lines (22) and/or control lines (24). Said interception means (18) are responsive to said generation means (16) in order to simultaneously feed the generated scan-in data into each of said scan chains (12) for initializing the electronic circuit (10). The invention further relates to a method for initializing an electronic circuit (10), as well as a data processing system (210) for initializing an electronic circuit (10).

15 Claims, 8 Drawing Sheets

(56) References Cited

U.S. PATENT DOCUMENTS

| | | | |
|---|---|---|---|
| 2004/0210808 A1* | 10/2004 | Motika | G01R 31/318569 |
| | | | 714/726 |
| 2006/0080585 A1* | 4/2006 | Kiryu | G01R 31/3177 |
| | | | 714/733 |
| 2006/0259838 A1* | 11/2006 | Nardini | G01R 31/318575 |
| | | | 714/726 |
| 2007/0234153 A1* | 10/2007 | Kawasaki | G01R 31/31857 |
| | | | 714/726 |
| 2009/0313511 A1 | 12/2009 | Goto et al. | |
| 2012/0072788 A1 | 3/2012 | Chen et al. | |
| 2012/0198280 A1* | 8/2012 | Cao | G06F 11/263 |
| | | | 714/32 |
| 2014/0149812 A1* | 5/2014 | Tekumalla | G01R 31/31855 |
| | | | 714/727 |
| 2015/0106672 A1* | 4/2015 | Kulkarni | G01R 31/318558 |
| | | | 714/727 |

* cited by examiner

ELECTRONIC CIRCUIT HAVING SERIAL LATCH SCAN CHAINS

BACKGROUND OF THE INVENTION

The present invention relates in general to data processing systems, and in particular, to an electronic circuit having latch scan chains, as well as to a method and a system for initializing or reinitializing the electronic circuit.

The most common method for delivering test data from electronic large vector sets with corresponding long tester time and memory circuit or chip inputs to internal circuits under test and observing their outputs, is the so-called scan-design or test data register (TDR) scan chain-design. In scan-design, registers (so called flip-flops or latches) in the design are connected in one or more scan chains which are used to gain access to internal nodes of the chip. Test patterns are shifted in via these scan chain(s), functional clock signals are pulsed to test the circuit during the capture cycle, and the results are then shifted out to chip output pins and compared against the expected results or accumulated internally through some compression/signature logic.

Straightforward application of scan techniques can result in requirements. Test compression techniques address this problem, by decompressing the scan input on chip and compressing the test output. Large gains are possible since any particular test vector usually only needs to set and/or examine a small fraction of the scan chain bits.

Integrated circuits having memory arrays that are designed and manufactured with memory built-in self test (MBIST) circuitry are well-known in the art. Integrated circuits employing MBIST generally include multiple different size arrays of memory elements that require testing. Typically, during MBIST testing, a test vector is written into an array and then a read operation is performed with the results analyzed to confirm proper operation of the array under the test vector. Within a given component or section of an integrated circuit, each array of that component is conventionally tested in series in order to analyze any result of the application of the respective test vector with the respective array.

U.S. Pat. No. 8,423,846 B2 discloses an integrated circuit having an MBIST circuitry configured to serially test multiple arrays of memory elements within a component of the integrated circuit and to also conduct parallel default initialization of the serially tested arrays. The parallel array clean up serves, inter alia, to reduce the time required to set the memory elements within the arrays to an initial state. Accordingly, this feature assists the integrated circuit to expeditiously exit a power off state with respect to the components in which it is implemented.

BRIEF SUMMARY

It is an object of the invention to provide an electronic circuit with features for speeding up custom initialization of the electronic circuit during a power on process or exit of a deep power management state.

Another object is to provide a method for speeding up custom initialization of an electronic circuit during a power on process or exit of a deep power management state.

A further object is to provide a system for speeding up custom initialization of an electronic circuit during a power on process.

Custom initialization means that the initialization is chip- or system-dependent and cannot be hard wired on the chip.

These objects are achieved by the features of the independent claims. The other claims, the drawings and the specification disclose advantageous embodiments of the invention.

According to a first aspect of the invention an electronic circuit is proposed having one or more latch scan chains, the electronic circuit comprising (i) a built-in test structure (e.g., Logic Built In Self Test (LBIST); (ii) generation means for simultaneously generating scan-in data for each of said scan chains; (iii) interception means for simultaneously intercepting test lines of said scan chains, said test lines comprising scan-in lines and/or control lines. Said interception means are responsive to said generation means in order to simultaneously feed the generated scan-in data into each of said scan chains for initializing the electronic circuit.

Particularly, the latch scan chains may be serial latch scan chains.

In modern electronic circuits or chips supporting advanced power management, it is a requirement to reinitialize a system or core processor or IP-block inside that chip very fast after powering it off and back on in order to reduce the initialization time versus the actual IP-block utilization time and save additional power. IP in this sense is used as a general intellectual property system which may be a software system or module or block or the like. Some systems can use a predefined initial value that can be applied by a global reset pin or a scan-0-initialization. Nevertheless a lot of complex systems or core processors need customization of the initial state based on, e.g., the system structure, the memory/cache repair solution that is per chip, or the like.

Initialization of an electronic circuit in this sense is meant as some kind of customization, which is to be done upon every start of a system or part of a system. Customization makes it possible to compensate for faults on the chip, e.g., due to a faulty chip design or due to faults in the production of the chip. Another reason is to adapt a chip to a particular system type or position in the system. Thus one chip may be used for different systems and different applications. By this way it is possible to make some kind of work around and use an existing chip design instead of being forced to make a new manufacturing mask. Thus customization is a cost and time saving approach for using electronic circuits in different applications and using electronic circuits with faults.

Initialization or customization is performed with data patterns that are fed into the scan chains. The patterns are determined offline, e.g. during chip testing or later after the chip has been deployed in the field.

The inventive solution enables initialization of a system or core processor consisting of latches while reusing an existing built-in-test structure on the chip. This built-in test structure is normally foreseen on the chip for testing the scan chains and/or the surrounding logic. Also feeding initialization data is performed in parallel and not serially, while reusing the internal test registers and pseudo-random pattern generators. The logic may be arbitrarily reinitialized within about a thousand cycles (length of the scan chains), independent of the size of the system. This has a large scalability/time advantage over the usual serial scan method or JTAG/TDR initialization. Only a few additional multiplexers are needed by this invention to complete its work leading to a very low additional logic overhead compared to a System Center Operations Manager (SCOM)/Memory-mapped I/O (MMIO) approach. The test logic can also automatically be inserted by tools making it correct by construction.

The proposed solution adds only very little change to the hardware and "reuses" the test logic, which is available on the chip, to initialize the core processor/system/IP-block.

The system takes over control of the test scan signals so that these can be used by a functional logic to initialize the scan chains. These scan chains have a defined depth (e.g., 1024 latches) so that the initialization is performed in only a few cycles, and all the chains are initialized in parallel via the existing test structure.

In the advantageous solution the test structure may be configured to input the scan-in data in parallel into the scan chains, which has a large scalability/time advantage over the usual serial scan method in initialization of the electronic circuit.

In one preferred embodiment, interception means may intercept the scan-in lines and the control lines, wherein the generation means fetch pre-configured data from a memory for feeding into the scan-in lines. This represents a first approach: a functional control takes over the parallel test scan-in data line as well as the scan control line. The parallel scan-in line is used to scan all the chains in parallel using the maximum width available to the test interface. For feeding the scan-in data the wide interface of the test structure is reused in order to initialize the scan chains.

In a second preferred embodiment, the interception means may intercept the control lines only, wherein the test structure is configured to contain the generation means. Due to this approach a functional control takes over only the scan control logic and reuses the available test register and test logic to generate the appropriate initialization pattern.

Advantageously, the generation means may comprise a data generator, particularly a parallel random pattern generator, to generate the scan-in data. The reused test structure may offer a parallel random pattern generator (PRPG), weighting logic, masking logic, scan decompressors, and the like, which are available normally for logic built-in self test and which may be reused to generate the appropriate initialization pattern once conditioned. The initialization pattern is highly configurable through seeding and masking. There may be a good probability that the right initialization pattern can be generated this way.

In a favorable embodiment the generation means may comprise instead of a data generator like, e.g., a parallel random pattern generator, at least two test control registers to be initialized with scan-in data or other initialization data. These registers may be initialized to an arbitrary value (e.g., by scan). This approach may be particularly useful for being applied with smaller numbers of initialization patterns as in the order of smaller than 10, in particular 4 to 5.

In a very common embodiment a circuit in the test logic may allow to force the value provided to all scan chains to all zeros instead of the value generated by the test logic.

Advantageously the scan-in data from one test control register may be selected by a multiplexer in an initialization cycle to be fed to the scan chains. This additional multiplexer may be used to select the value that gets pushed to the logic.

In a favorable embodiment the interception means may be implemented as a state machine. As the interception means may be configured as a functional control the use of a state machine for implementing the interception means may represent a very convenient and practical solution as configuration management is quite flexible.

Favorably the scan chains may comprise test data registers (TDR). The scan chains being adapted to be used for the inventive solution may be represented as flops stumps or test data registers, where flops are storage elements for one bit, and stumps are a serial arrangement of a number of storage elements, e.g., 32 or 64 bits.

Advantageously, the interceptions means may comprise a configurable memory. This configurable memory may serve as input for initialization patterns for the cases where the initialization patterns are not generated within the test structure itself, but are only fed via the test structure into the scan-in lines in order to initialize the scan chains.

According to a further advantageous aspect of the invention a method for initializing or reinitializing an electronic circuit is proposed, comprising the steps (i) generating by generation means simultaneously the scan-in data for each of said scan chains; (ii) intercepting by interception means simultaneously the test lines of said scan chains, said test lines comprising scan-in lines and/or control lines; (iii) said interception means being responsive to said generation means; (iv) feeding the generated scan-in data into each of said scan chains. The described method serves for implementation of an initialization process based on the hardware of an electronic circuit as described above. Thus, a method is proposed which exhibits advantages concerning scalability and time savings compared to serial initialization approaches of the state of the art.

Favorably the interception means may intercept the scan-in lines and the control lines, wherein the generation means fetch pre-configured data from the memory to be fed to the scan-in lines. This represents a first method according to the invention: a functional control takes over the parallel test scan-in data line as well as the scan control line. The parallel scan-in line is used to scan all the chains in parallel using the maximum width available to the test interface. For feeding the scan-in data the wide interface of the test structure is reused in order to initialize the scan chains.

In a second advantageous method according to the invention, the interception means may intercept the control lines, wherein the generation means are contained in the test structure. Due to this second method a functional control takes over only the scan control logic and reuses the available test registers and test logic to generate the appropriate initialization pattern. For data generation either, in a first alternative of the second method, a data generator like, e.g., a parallel random pattern generator may be used, or, in a second alternative of the second method, test control registers may be used.

According to a further advantageous aspect of the invention a data processing program for execution in a data processing system is proposed comprising an implementation of an instruction set for performing a method as described above when the data processing program is run on a computer.

Further a favorable computer program product is proposed comprising a computer-usable medium including a computer-readable program, wherein the computer-readable program when executed on a computer causes the computer to perform a method for initializing an electronic circuit, comprising the steps (i) generating by generation means simultaneously the scan-in data for each of said scan chains; (ii) intercepting by interception means simultaneously the test lines of said scan chains, said test lines comprising scan-in lines and/or control lines; (iii) said interception means being responsive to said generation means; (iv) feeding the generated scan-in data into each of said scan chains.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, aspects of the present invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device. A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to block diagrams of methods, apparatus (systems) and computer program products according to embodiments of the invention. It will be understood that each block of the flowchart illustrations and/or block diagrams, and combinations of blocks in the block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

Due to a further aspect of the invention, a data processing system for execution of a data processing program is proposed, comprising software code portions for performing a method described above.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments, wherein is shown in.

DETAILED DESCRIPTION

Figure 1:
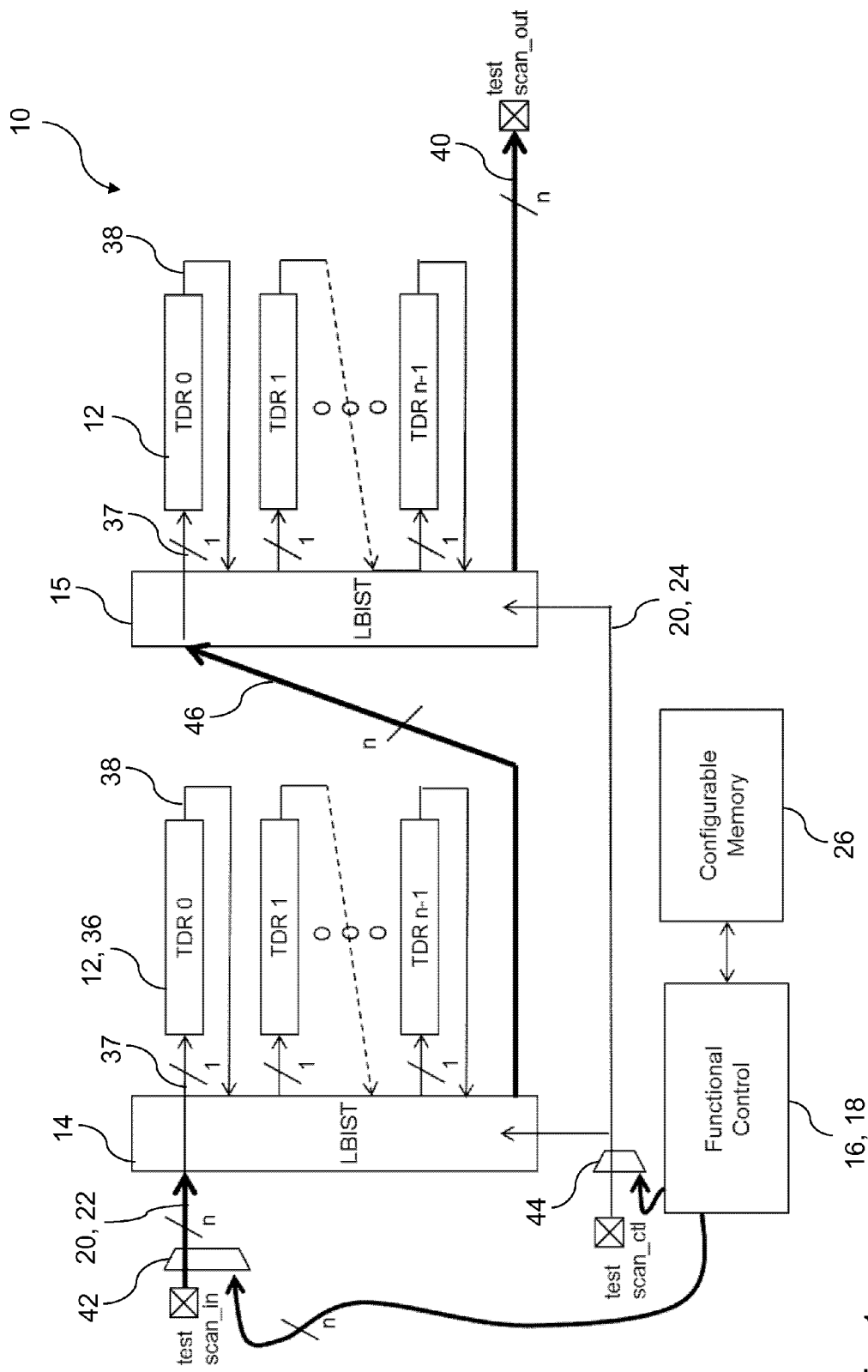
FIG. 1 illustrates an electronic circuit with the test structure configured for custom initialization with interception means for intercepting scan-in lines and control lines according to an embodiment of the invention.

In the drawings, like elements are referred to with like reference numerals. The drawings are merely schematic representations, not intended to portray specific parameters of the invention. Moreover, the drawings are intended to depict only typical embodiments of the invention and therefore should not be considered as limiting the scope of the invention.

FIG. 1 shows an electronic circuit 10 with the test structure 14 configured for custom initialization with interception means 18 for intercepting scan-in lines 22 and control lines 24 according to an embodiment of the invention. The electronic circuit 10 includes one or more serial latch scan chains 12, and comprises further (i) a built-in test structure 14 for testing the scan chains 12 or the surrounding logic; (ii) generation means 16 for simultaneously generating scan-in data for each of said scan chains 12; (iii) interception means 18 for simultaneously intercepting test lines 20 of said scan chains 12, said test lines 20 comprising scan-in lines 22 and/or control lines 24. Said interception means 18 are responsive to said generation means 16 in order to simultaneously feed the generated scan-in data into each of said scan chains 12 for initializing the electronic circuit 10. The test structure 14, realized in the logic built-in self test (LBIST) of the electronic circuit 10, is configured to input the scan-in data parallel into the scan chains 12.

The scan chains 12 being adapted to be used for the inventive solution may be represented as flops stumps or test data registers (TDR), where flops are storage elements for one bit, and stumps are a serial arrangement of a number of storage elements, e.g., 32 or 64 bits or more.

In FIG. 1 and in the following Figures, the scan chains 12 are named with TDR 0 to TDR n-1, where n typically represents 32 or 64 bit width. Reference numerals are marked only for TDR 0 for clarity of the Figure, but are meant for the other scan chains 12 likewise. Lines marked with /n are n bit wide which means that n bits are fed in parallel, whereas lines marked with /1 are serial lines that are 1 bit wide.

In the embodiment shown in FIG. 1, the interception means 18 intercept the scan-in lines 22 and the control lines 24, and the generation means 16 fetch pre-configured data from a memory 26 for feeding into the scan-in lines 22. The interception means 18 comprise a configurable memory, where the initialization pattern, defined during the design process of the electronic circuit 10, is stored for use in the initialization process of the electronic circuit 10.

The interception means 18 as well as the generation means 16 are implemented in a functional control unit where the initialization pattern for the scan chains 12 are fetched from the configurable memory 26 and fed through a multiplexer 42 to the scan-in lines of the electronic circuit 10. The scan-in data are fed by the test structure 14 in parallel to all scan chains 12, where the scan-in lines are n bits wide, where n is, e.g., 32 or 64, whereas the input lines 37 of the scan chains 12 are 1 bit wide. Thus, all n scan chains 12 receive the initialization data simultaneously.

Both test structures 14, 15 in FIG. 1 are connected via a parallel line 46 which serves for feeding the scan-in data through in parallel from the first test structure 14 to the second test structure 15. The control data are fed through a multiplexer 44 to the control line 24 and serve for controlling and steering the initialization process. The output lines 38 of the scan chains 12 are connected to the test structure 14 again. The output data of the scan chains 12 are scanned out through the scan-out line 40 for further usage, e.g. a test.

The interception means 18 are implemented as a state machine. As the interception means 18 may be configured as a functional control unit, the use of a state machine for implementing the interception means 18 may represent a very convenient and practical solution as configuration management is quite flexible.

Figure 2:
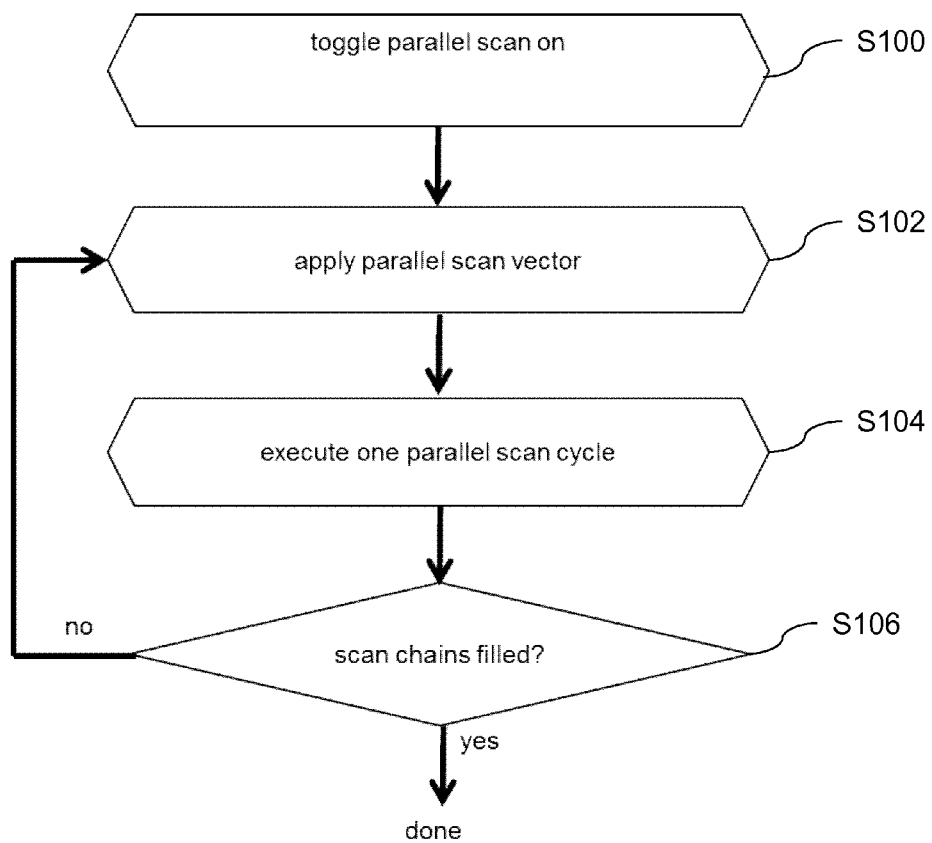
FIG. 2 depicts a flowchart explaining the process of custom initialization of an electronic circuit with the test structure configured for feeding initialization patterns using interception means for intercepting scan-in lines and control lines according to an embodiment of a method according to the invention.

In FIG. 2 a flowchart is shown, explaining the process of custom initialization of an electronic circuit 10 with the test structure 14 configured for feeding initialization patterns using interception means 18 for intercepting scan-in lines 22 and control lines 24 according to an embodiment of a method of the invention.

In the electronic circuit 10, shown in FIG. 1, a first method for initializing an electronic circuit 10 is implemented, comprising the steps (i) generating by generation means 16 simultaneously the scan-in data for each of said scan chains 12; (ii) intercepting by interception means 18 simultaneously the test lines 20 of said scan chains 12, said test lines 20 comprising scan-in lines 22 and/or control lines 24; (iii) said interception means 18 being responsive to said generation means 16; (iv) feeding the generated scan-in data into each of said scan chains 12. The interception means 18 intercept the scan-in lines 22 and the control lines 24, wherein the generation means 16 fetch pre-configured data from the memory 26 to be fed to the scan-in lines 22.

In step S100 the initialization process is started. Then the initialization pattern are fetched by the generation means 16 from the configurable memory 26 and applied by the interception means 18 to the scan-in lines 22 (step S102). Next in step S104 one cycle of parallel initialization pattern is executed to the scan chains 12 via the test structure 14. In step 106 it is checked whether all scan chains 12 are filled with the initialization pattern. If not, steps S102 and S104 are repeated until all scan chains 12 are filled.

Figure 3:
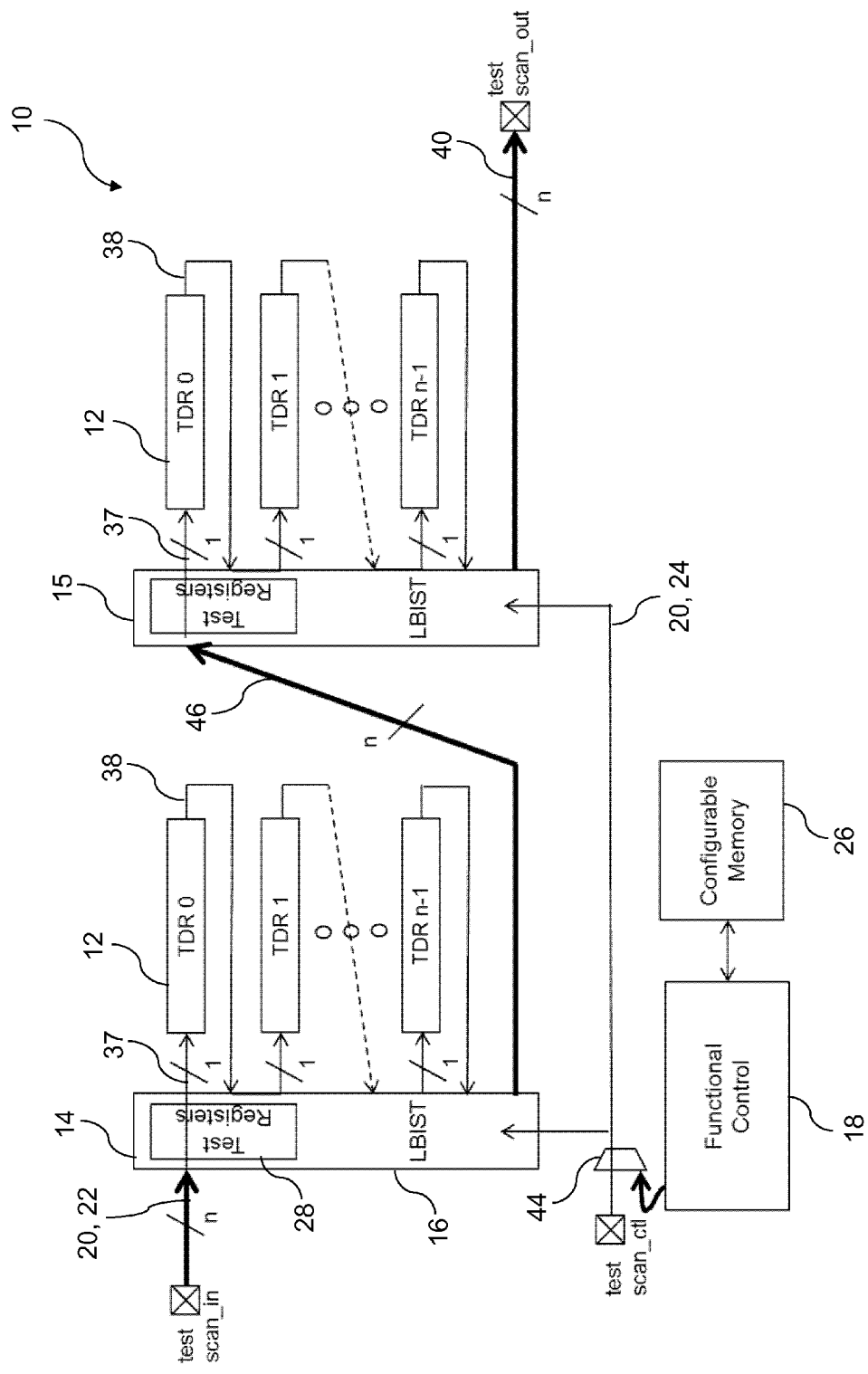
FIG. 3 illustrates an electronic circuit with the test structure configured for custom initialization with interception means for intercepting control lines according to another embodiment of the invention.
Figure 4:
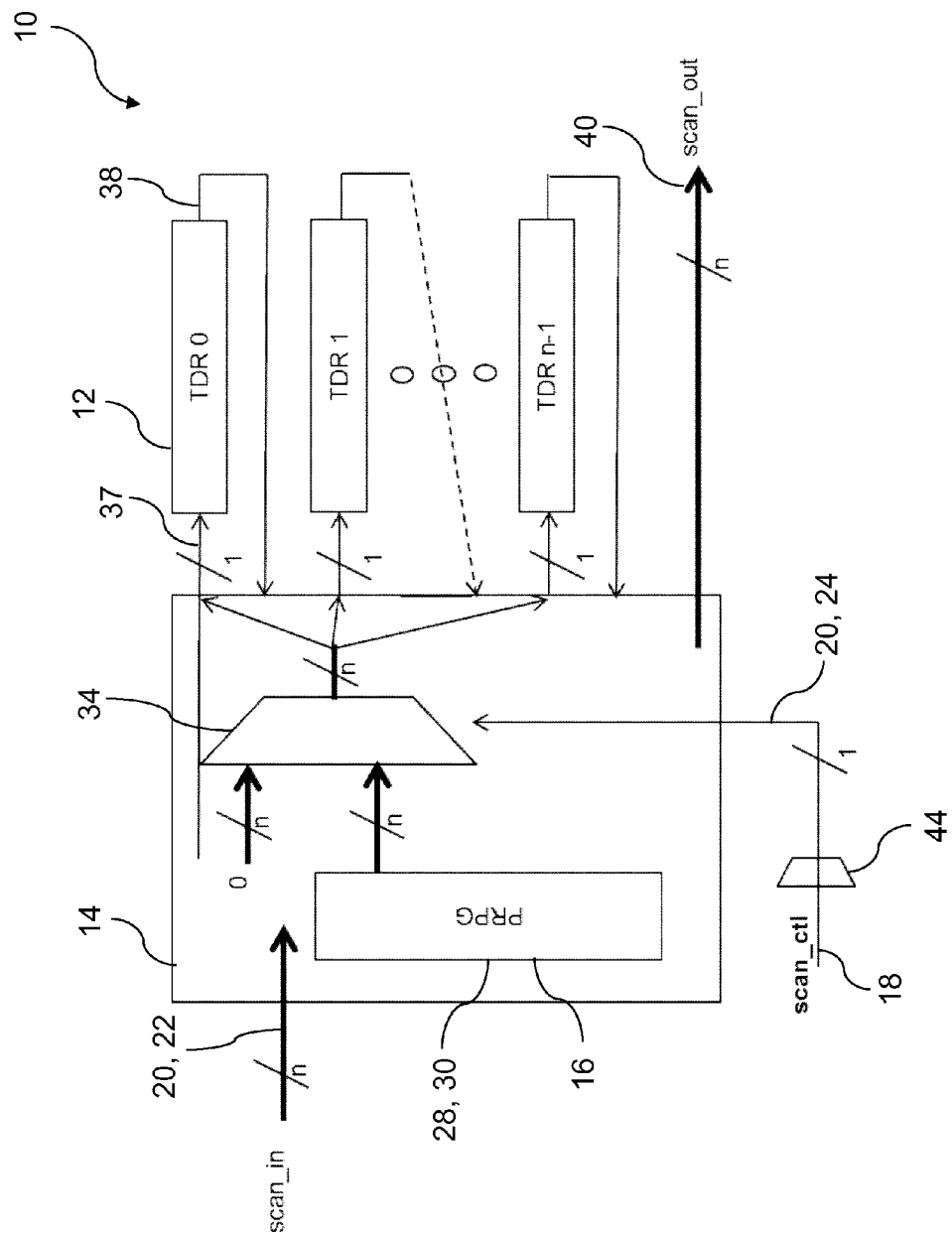
FIG. 4 depicts the electronic circuit of FIG. 3 using a data generator in the test structure as generation means for scan-in data according to an embodiment of the invention.

FIG. 3 shows an electronic circuit 10 with the test structure 14 configured for custom initialization with interception means 18 for intercepting control lines 24 according to another embodiment of the invention. Here the interception means 18 intercept the control lines 24 only, wherein the test structure 14 is configured to contain the generation means 16 to generate the scan-in data. The generation means 16 comprise a data generator 28, particularly a parallel random pattern generator 30 as shown in FIG. 4. However, generation means 16 is not limited to this embodiment. In this embodiment the functional control unit includes only the interception means 18 that feeds data through a multiplexer 44 to the control line 24. The initialization patterns are generated by the data generator 28 and fed upon signal by the interception means 18 from the test structure 14 to the input lines 37 of the scan chains 12.

FIG. 4 illustrates in more detail the electronic circuit 10 of FIG. 3, which uses a data generator 28 in the test structure 14 as the generation means 16 for scan-in data according to an embodiment of the invention. The method implemented here is characterized by the interception means 18 intercepting the control lines 24 only, wherein the generation means 16, implemented as a data generator 28, are contained in the test structure 14. As a data generator 28, a parallel random pattern generator (PRPG) 30 may be used which is already implemented in the test structure 14 for testing purposes. The scan-in data generated are fed via a multiplexer 34 simultaneously to the input lines 37 of the scan chains 12. As the PRPG 30 is not able to produce a "0"-pattern, a separate input to the multiplexer 34 is given with a "0"-pattern, which is selected by the interception means 18, controlling the scan-in process via the control line 24, fed by the multiplexer 44 from the interception means 18.

Figure 5:
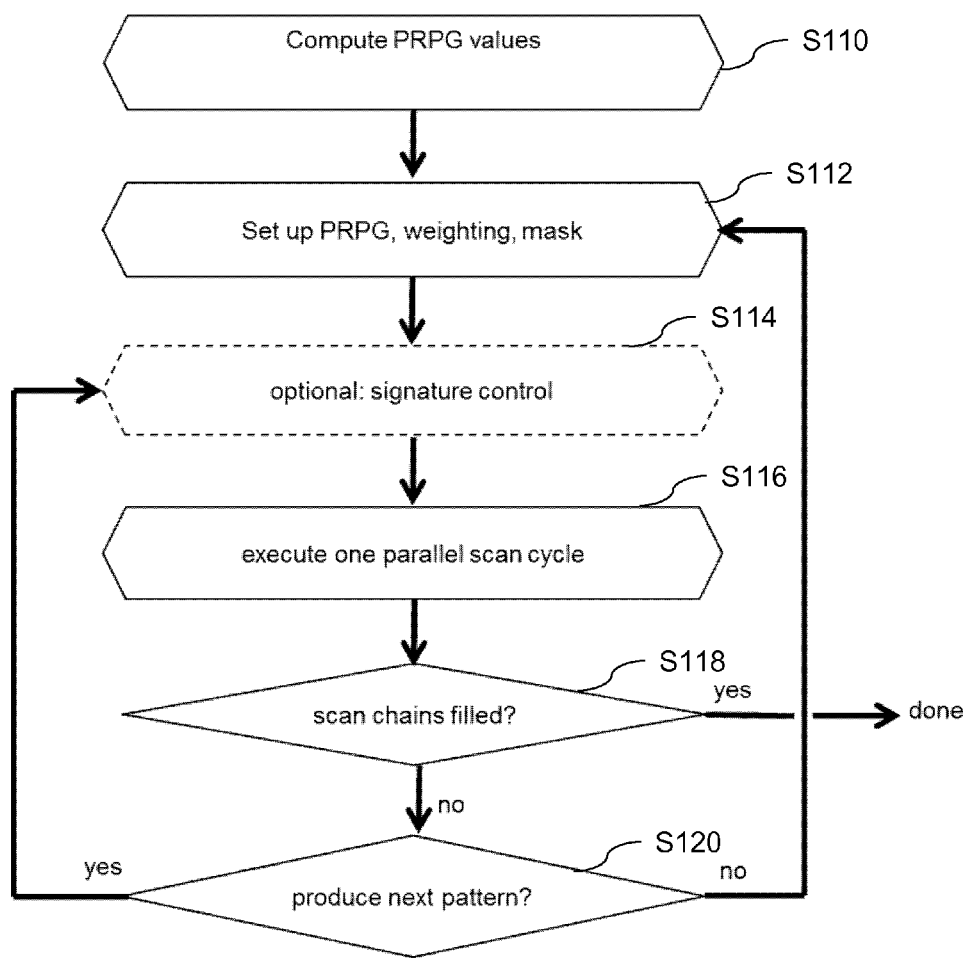
FIG. 5 illustrates a flowchart explaining custom initialization of the electronic circuit of FIG. 4 according to an embodiment of a method according to the invention.

FIG. 5 shows a flowchart explaining custom initialization of the electronic circuit 10 of FIG. 4 according to an embodiment of a method of the invention. This represents a second method with the test structure 14 configured for custom initialization with interception means 18 for intercepting control lines 24 only. In a first alternative of the second method, described in FIG. 5, a data generator 28, particularly a parallel random pattern generator (PRPG) 30, which is implemented in the test structure 14, is used as generation means 16 to generate the scan-in data.

First the required setup values, necessary to achieve the desired initialization pattern, are computed in step S110. Then, in step S112, the PRPG 30 is set up, and weighting and masking values fetched from the configurable memory 26. Next in the optional step S114, the data pattern generated can be steered directly in each loop similar to what happens during an OPMISR++ operation, until in step S116, one parallel scan cycle of feeding scan-in data to the scan chains 12 is executed. In step S118, it is checked if all scan chains 12 are filled. If yes, the process is ended. If no, it is checked in step S120, if the PRPG 30 is able to produce the next initialization pattern. If no, then the process is repeated from step S112 on forward. If yes, the process is repeated from step S114 on forward, until all scan chains 12 are filled with scan-in data.

Figure 6:
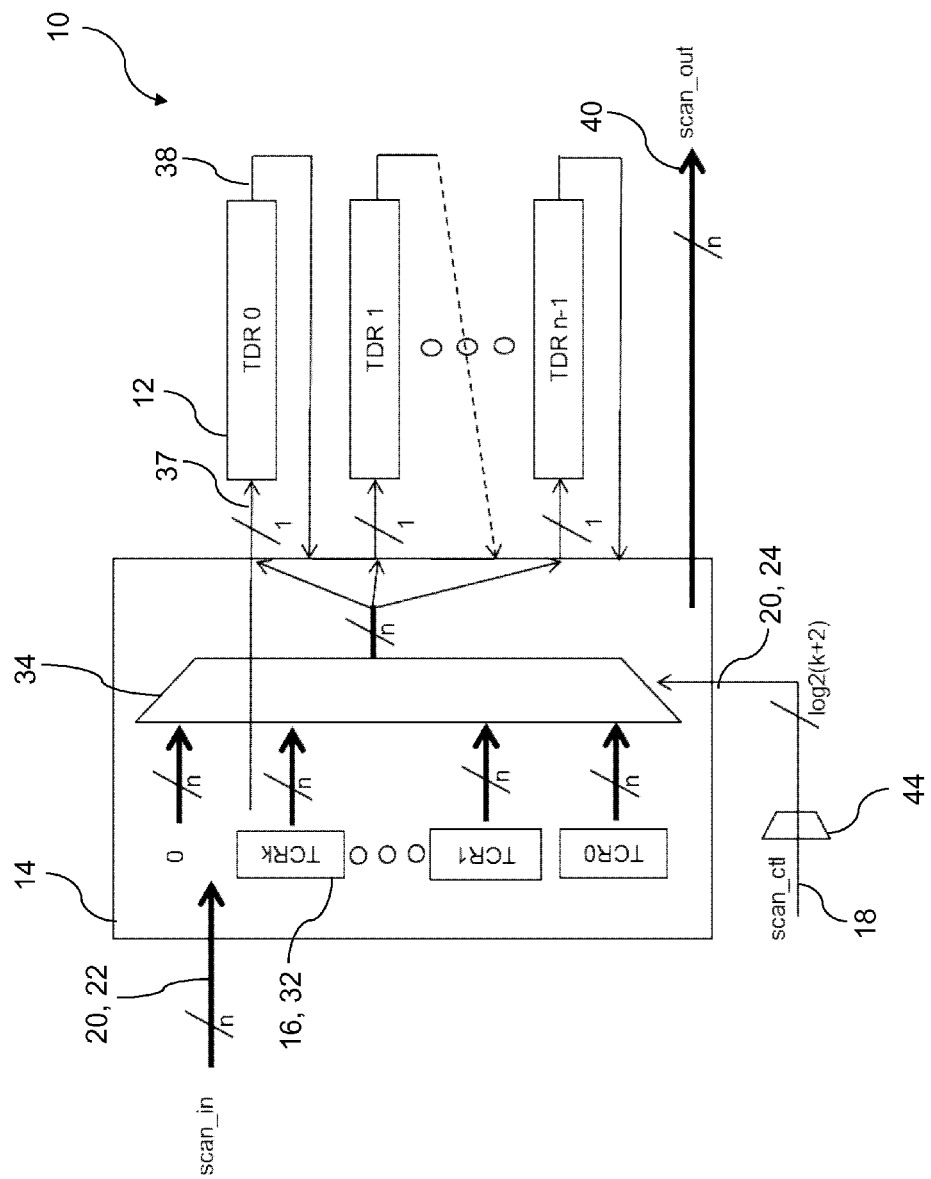
FIG. 6 depicts the electronic circuit of FIG. 3 using test control registers in the test structure as generation means for scan-in data according to an embodiment of the invention.

FIG. 6 shows the electronic circuit of FIG. 3 using test control registers (TCR) 32 in the test structure 14 as generation means 16 for scan-in data according to an embodiment of the invention. Here the generation means 16 comprise at least two test control registers 32, to be initialized with scan-in data, wherein the scan-in data from one test control register (TCR) 32 are selected by a multiplexer 34 in an initialization cycle to be fed to the scan chains 12. In FIG. 6 k+1 TCRs 32 are shown, where k equals a number greater than or equal to 1, for example, 4 to 5. All the test control registers 32 are connected to the multiplexer 34. The scan-in data of the TCR 32 that is selected by the interception means 18 via the control line 24 that is fed by multiplexer 44 from the interception means 18 are fed via the multiplexer 34 to the input lines 37 of the scan chains 12. As there may be no "0"-pattern in the TCR 32 and this might be the most probable pattern, an extra input to the multiplexer 34 is serving for input of the "0"-pattern if needed as an initialization pattern.

Figure 7:
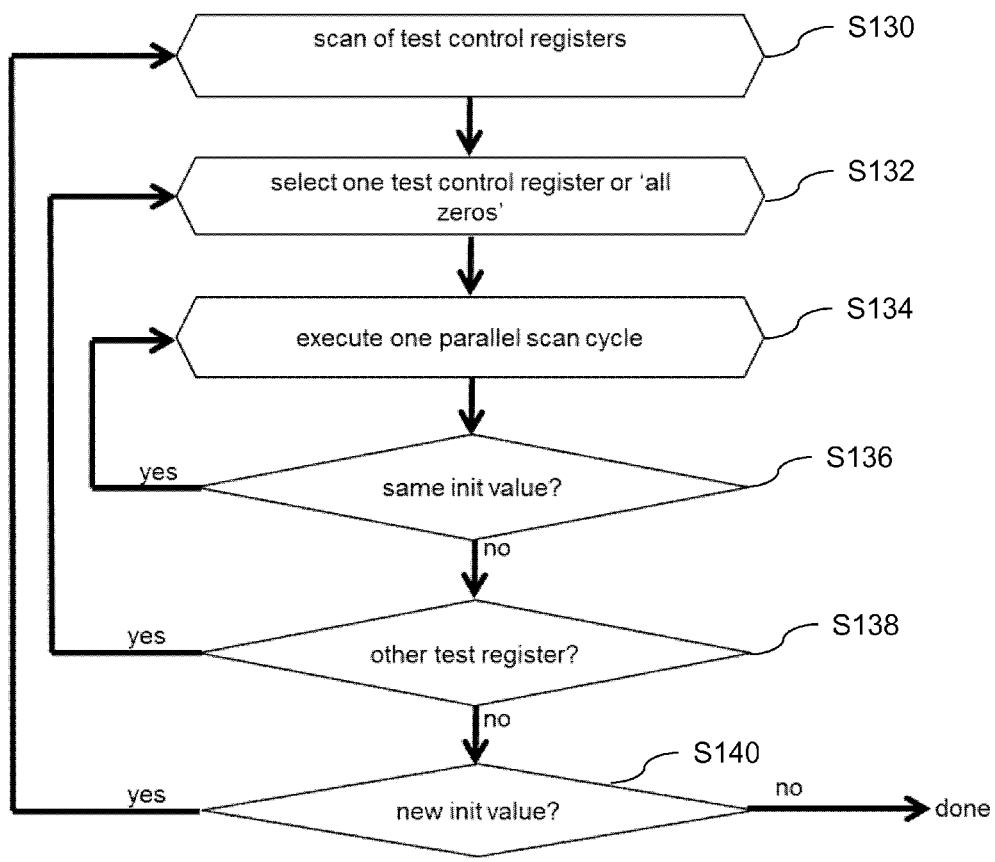
FIG. 7 illustrates a flowchart explaining custom initialization of the electronic circuit of FIG. 6 according to an embodiment of a method according to the invention.

In FIG. 7 a flowchart explaining custom fast initialization of the electronic circuit 10 of FIG. 6 according to an embodiment of a method of the invention is shown. This represents also the second method with the test structure 14 configured for custom initialization with interception means 18 for intercepting control lines 24 only. But in this second alternative, described in FIG. 7, test control registers (TCR), already implemented in the test structure 14, are reused as generation means 16.

The process starts in step S130 with a parallel or serial scan of the TCRs 32 to fill the TCRs 32 with the appropriate data. In step S132 the interception means 18 of the functional control is set to select one of the TCRs 32 via the control line 24 fed via the multiplexer 44 from the interception means 18. The alternative is to select the "0"-pattern as an input to the multiplexer 34. Next in step S134 one parallel scan cycle is performed to feed the scan-in data to the input lines 37 of the scan chains 12. In step S136 it is checked if the same initialization pattern will be kept. If yes, then the last step S134 is repeated; if no, it is checked in step S138 if another TCR 32 is to be selected. If yes, the process is repeated from step S132 forward; if no, it is checked in step S140 if a new initialization pattern is needed. If no, then the whole process is ended; if yes, the process is restarted from the first step S130 on forward.

Figure 8:
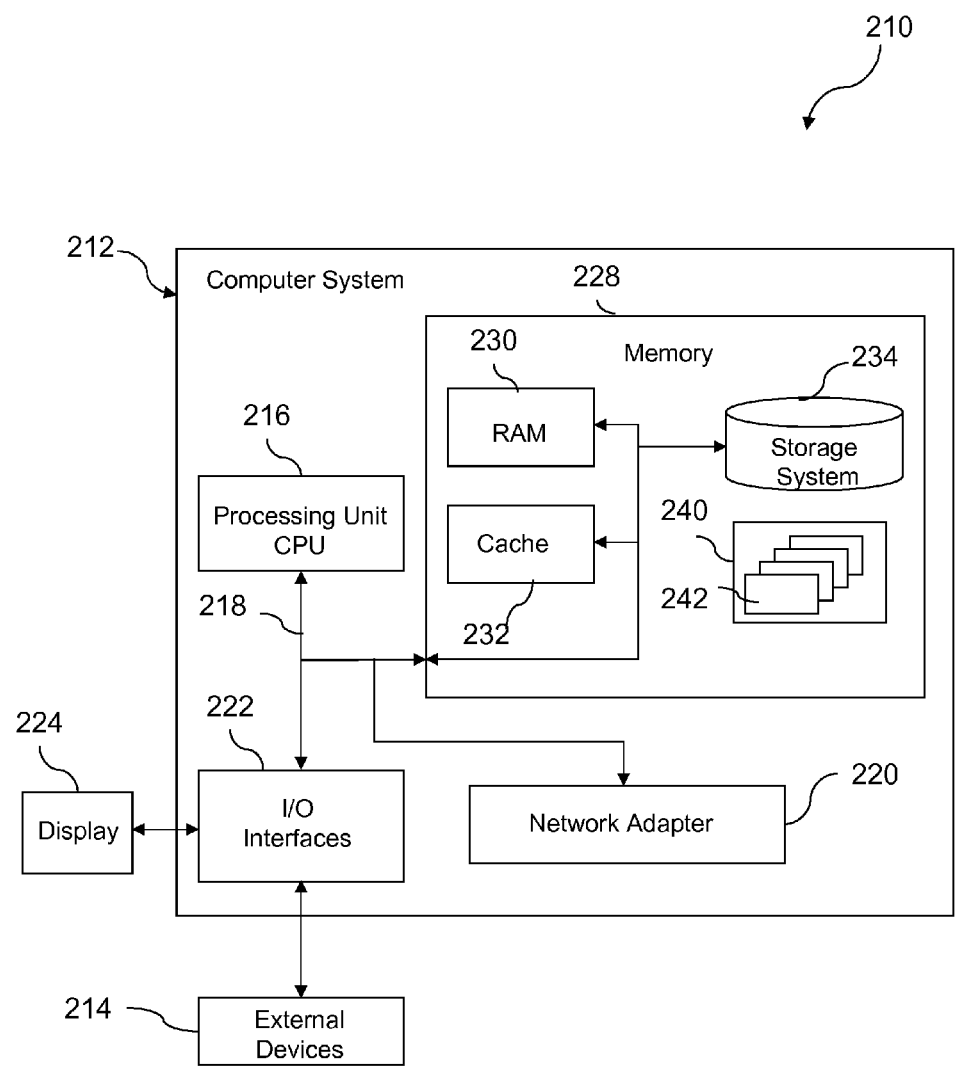
FIG. 8 depicts an example embodiment of a data processing system for carrying out a method according to the invention.

Referring now to FIG. 8, a schematic of an example of a data processing system 210 is shown. Data processing system 210 is only one example of a suitable data processing system and is not intended to suggest any limitation as to the scope of use or functionality of embodiments of the invention described herein. Regardless, data processing system 210 is capable of being implemented and/or performing any of the functionality set forth herein above.

The data processing system 210 is capable of running a computer program product comprising a computer-usable medium including a computer-readable program, wherein the computer-readable program when executed on a computer 212 causes the computer 212 to perform a method for initializing an electronic circuit 10, comprising the steps (i) generating by generation means 16 simultaneously the scan-in data for each of said scan chains 12; (ii) intercepting by interception means 18 simultaneously the test lines 20 of said scan chains 12, said test lines 20 comprising scan-in lines 22 and/or control lines 24; (iii) said interception means 18 being responsive to said generation means 16; (iv) feeding the generated scan-in data into each of said scan chains 12.

In data processing system 210 there is a computer system/server 212, which is operational with numerous other general purpose or special purpose computing system environments or configurations. Examples of well-known computing systems, environments, and/or configurations that may be suitable for use with computer system/server 212 include, but are not limited to, micro-controllers, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processor 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 typically includes a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232. Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As will be further depicted and described below, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an operating system, one or more application programs, other program modules, and program data. Each of the operating system, one or more application programs, other program modules, and program data or some combination thereof, may include an implementation of a networking environment. Program modules 242 generally carry out the functions and/or methodologies of embodiments of the invention as described herein. Computer system/server 212 may also communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples, include, but are not limited to: microcode, device drivers, redundant processing units, external disk drive arrays, RAID systems, tape drives, and data archival storage systems, etc.

The block diagrams in the figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical functions. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

The invention claimed is:

1. An electronic circuit coupled to one or more latch scan chains, the electronic circuit comprising:
   a logic built in self test (LBIST) including a test control register initialized to generate scan-in data, the scan-in data comprising a pre-determined initialization pattern;
   an interception circuit provided outside of the LBIST and connected to the LBIST through a multiplexer, the interception circuit configured to apply a control signal to the LBIST through the multiplexer during a power on process or an exit of a deep power management state of the electronic circuit, the control signal configured to cause the test control register to generate the scan-in data including the pre-determined initialization pattern and provide the pre-determined initialization pattern to the one or more latch scan chains in parallel to initialize the electronic circuit during the power on process or exit of the deep power management state.

2. The electronic circuit according to claim 1, wherein the interception circuit is further configured to:
   determine whether the pre-determined initialization pattern is to be used for an additional initialization cycle; and
   in response to determining that the pre-determined initialization pattern is to be used for an additional initialization cycle, apply the control signal to the first LBIST through the multiplexer for the additional initialization cycle.

3. The electronic circuit according to claim 2, wherein the interception circuit is further configured to:
   in response to determining that the pre-determined initialization pattern is not to be used for an additional initialization cycle, perform one of:
   apply a second control signal to the first LBIST through the multiplexer, the second control signal configured to cause a second test control register to generate second scan-in data including a second pre-determined initialization pattern and provide the second pre-determined initialization pattern simultaneously to the one or more latch scan chains in parallel to initialize the electronic circuit and;
   reinitialize the test control register to a value other than the scan-in data.

4. The electronic circuit according to claim 1, wherein the interception circuit comprises a state machine.

5. The electronic circuit according to claim 1, further comprising:
   wherein the LBIST is connected to input lines of the one or more latch scan chains, and output lines of the one or more latch scan chains are connected back to the LBIST.

6. The electronic circuit according to claim 1, further comprising:
   a second LBIST connected to the LBIST and to one or more of the latch scan chains;
   wherein the test control register of the LBIST is configured to provide the pre-determined initialization pattern to the second LBIST, the second LBIST providing the pre-determining initialization pattern to the one or more latch scan chains connected to the second LBIST in parallel to initialize the electronic circuit during the power on process or exit of the deep power management state.

7. A method for initializing an electronic circuit including a logic built in self test (LBIST) and an interception circuit provided outside of a first LBIST and connected to the first LBIST through a multiplexer, wherein the electronic circuit is coupled to one or more latch scan chains, the method comprising:
   initializing a test control register of the LBIST to generate scan-in data, the scan-in data comprising a pre-determined initialization pattern;
   applying, by the interception circuit, a control signal to the LBIST through the multiplexer during a power on process or an exit of a deep power management state of the electronic circuit the control signal causing the test control register to generate the scan-in data including the pre-determined initialization pattern and provide the pre-determined initialization pattern to the one or more latch scan chains in parallel to initialize the electronic circuit during the power on process or exit of the deep power management state.

8. The method according to claim 7, wherein the initialization of the electronic circuit further comprises:
   determining whether the pre-determined initialization pattern is to be used for an additional initialization cycle; and
   in response to determining that the pre-determined initialization pattern is to be used for an additional initialization cycle, applying, by the interception circuit, the control signal to the first LBIST through the multiplexer for the additional initialization cycle.

9. The method according to claim 7, wherein the initialization of the electronic circuit further comprises:
   in response to determining that the pre-determined initialization pattern is not to be used for an additional initialization cycle performing one of:
      applying, by the interception circuit, a second control signal to the first LBIST through the multiplexer, the second control signal causing a second test control register to generate second scan-in data including a second pre-determined initialization pattern and provide the second pre-determined initialization pattern simultaneously to the one or more latch scan chains in parallel to initialize the electronic circuit; and
      reinitializing the control register to a value other than the scan-in data.

10. The method according to claim 7, and further comprising implementing the interception circuit utilizing a state machine.

11. The method according to claim 7, wherein the control signal causes the test control register to provide the pre-determined initialization pattern to a second LBIST connected to the LBIST and to one or more of the latch scan chains, the second LBIST providing the pre-determining initialization pattern to the one or more latch scan chains connected to the second LBIST in parallel to initialize the electronic circuit during the power on process or exit of the deep power management state.

12. A computer program product, comprising:
   a non-transitory computer-readable storage device;
   program code stored in the computer-readable storage device for initializing an electronic circuit including a first logic built in self test (LBIST) and an interception circuit connected to the LBIST through a multiplexer, wherein the electronic circuit is coupled to one or more latch scan chains, wherein the program code, when executed by a processor, causes the processor to perform:
   initializing a test control register of the LBIST to generate scan-in data, the scan-in data comprising a pre-determined initialization pattern;
   applying, by the interception circuit, a control signal to the LBIST through the multiplexer during a power on process or an exit of a deep power management state of the electronic circuit the control signal causing the test control register to generate the scan-in data including the pre-determined initialization pattern and provide the pre-determined initialization pattern to the one or more latch scan chains in parallel to initialize the electronic circuit during the power on process or exit of the deep power management state.

13. The program product according to claim 12, wherein to initialize the electronic circuit, the program code causes the processor to perform:
   determining whether the pre-determined initialization pattern is to be used for an additional initialization cycle; and
   in response to determining that the pre-determined initialization pattern is to be used for an additional initialization cycle, applying, by the interception circuit, the control signal to the first LBIST through the multiplexer for the additional initialization cycle.

14. The program product according to claim 13, wherein to initialize the electronic circuit, the program code causes the processor to perform:
   in response to determining that the pre-determined initialization pattern is not to be used for an additional initialization cycle, performing one of:
   applying, by the interception circuit, a second control signal to the first LBIST through the multiplexer, the second control signal causing a second test control register to generate second can-in data including a second pre-determined initialization pattern and provide the second pre-determined initialization pattern simultaneously to the one or more latch scan chains in parallel to initialize the electronic circuit and reinitializing the test control register to a value other than the scan-in data.

15. The program product according to claim 12, wherein the control signal causes the test control register to provide the pre-determined initialization pattern to a second LBIST connect to the LBIST and to one or more of the latch scan chains, the second LBIST providing the pre-determining initialization pattern to the one or more latch scan chains connected to the second LBIST in parallel to initialize the electronic circuit during the power on process or exit of the deep power management state.

* * * * *